US011791391B1

(12) United States Patent
Karda et al.

(10) Patent No.: US 11,791,391 B1
(45) Date of Patent: Oct. 17, 2023

(54) INVERTERS, AND RELATED MEMORY DEVICES AND ELECTRONIC SYSTEMS

(71) Applicant: Micron Technology, Inc., Boise, ID (US)

(72) Inventors: Kamal M. Karda, Boise, ID (US); Haitao Liu, Boise, ID (US); Durai Vishak Nirmal Ramaswamy, Boise, ID (US); Karthik Sarpatwari, Boise, ID (US); Richard E. Fackenthal, Carmichael, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/655,479

(22) Filed: Mar. 18, 2022

(51) Int. Cl.
*H01L 29/423* (2006.01)
*H01L 27/02* (2006.01)
*H01L 27/092* (2006.01)
*G11C 5/02* (2006.01)
*H10B 10/00* (2023.01)

(52) U.S. Cl.
CPC ........ *H01L 29/42372* (2013.01); *G11C 5/025* (2013.01); *H01L 27/0207* (2013.01); *H01L 27/092* (2013.01); *H10B 10/12* (2023.02)

(58) Field of Classification Search
CPC .......... H01L 29/42372; H01L 27/0207; H01L 27/092; G11C 5/025; H10B 10/12
USPC ........................................................ 365/156
See application file for complete search history.

(56) References Cited

U.S. PATENT DOCUMENTS

| 6,963,103 | B2 | 11/2005 | Forbes |
| 7,101,747 | B2 | 9/2006 | Hu |
| 7,351,628 | B2 | 4/2008 | Forbes et al. |
| 7,355,203 | B2 | 4/2008 | Dennison |
| 8,319,287 | B2 | 11/2012 | Lavoie et al. |
| 8,503,224 | B2 | 8/2013 | Katti et al. |
| 8,643,113 | B2 | 2/2014 | Chambers et al. |
| 8,710,583 | B2 * | 4/2014 | Ananthan ......... H01L 29/42376 257/330 |
| 8,896,059 | B1 * | 11/2014 | Kim .................... H01L 29/4236 257/331 |
| 2017/0092649 | A1 | 3/2017 | Takaoka |
| 2021/0074811 | A1 | 3/2021 | Watanabe et al. |
| 2022/0320079 | A1 * | 10/2022 | Gardner .......... H01L 21/823835 |
| 2022/0320090 | A1 * | 10/2022 | Hsu ................. H01L 21/823878 |
| 2023/0038957 | A1 * | 2/2023 | Xie ..................... H01L 21/8221 |

FOREIGN PATENT DOCUMENTS

WO WO-2021216251 A1 * 10/2021 ......... H01L 29/1041

* cited by examiner

*Primary Examiner* — Fernando Hidalgo
(74) *Attorney, Agent, or Firm* — TraskBritt

(57) ABSTRACT

An inverter includes a transistor, an additional transistor overlying the transistor, and a hybrid gate electrode interposed between and shared by the transistor and the additional transistor. The hybrid gate electrode includes a region overlying a channel structure of the transistor, an additional region overlying the region and underlying an additional channel structure of the additional transistor, and further region interposed between the region and the additional region. The region has a first material composition. The additional region has a second material composition different than the first material composition of the region. Memory devices and electronic systems are also described.

20 Claims, 4 Drawing Sheets

INVERTERS, AND RELATED MEMORY DEVICES AND ELECTRONIC SYSTEMS

TECHNICAL FIELD

The disclosure, in various embodiments, relates generally to the field of microelectronic device design and fabrication. More specifically, the disclosure relates inverters, and to related memory devices and electronic systems.

BACKGROUND

Microelectronic device designers often desire to increase the level of integration or density of features within a microelectronic device by reducing the dimensions of the individual features and by reducing the separation distance between neighboring features. In addition, microelectronic device designers often desire to design architectures that are not only compact, but offer performance advantages, as well as simplified, easier and less expensive to fabricate designs.

One example of a microelectronic device is a memory device. Memory devices are generally provided as internal integrated circuits in computers or other electronic devices. There are many types of memory including, but not limited to, random-access memory (RAM), read only memory (ROM), static random access memory (SRAM), dynamic random access memory (DRAM), synchronous dynamic random access memory (SDRAM), Flash memory, and resistance variable memory. Challenges related to memory device fabrication include decreasing the size of a memory device and increasing the storage density of a memory device.

DETAILED DESCRIPTION

Figure 1:
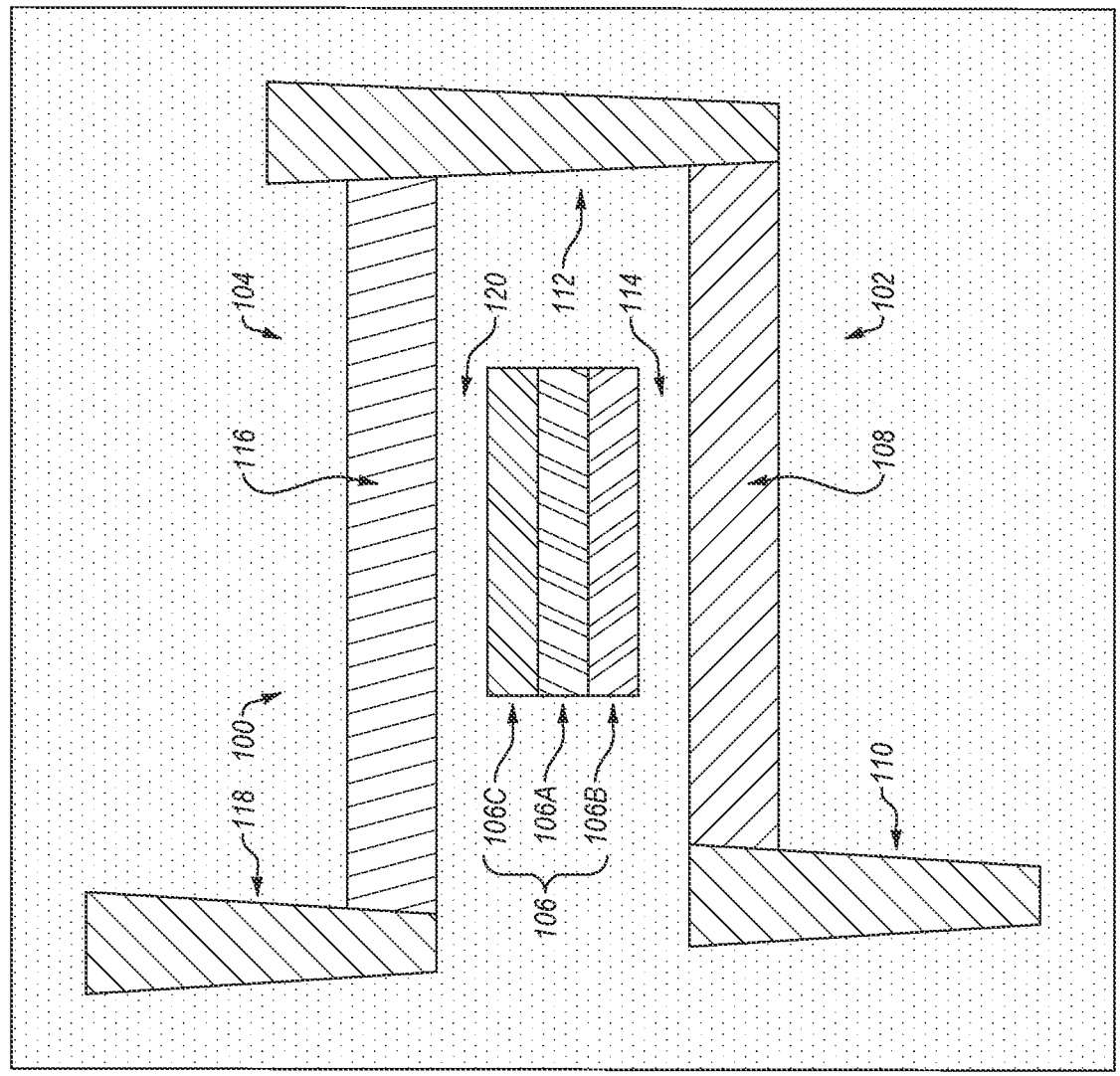
FIG. 1 is a simplified, partial cross-sectional view of an inverter, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional non-volatile memory, such as conventional NAND memory; conventional volatile memory, such as conventional DRAM), but also includes an application specific integrated circuit (ASIC) (e.g., a system on a chip (SoC)), a microelectronic device combining logic and memory, and a graphics processing unit (GPU) incorporating memory.

As used herein, the term "configured" refers to a size, shape, material composition, orientation, and arrangement of one or more of at least one structure and at least one apparatus facilitating operation of one or more of the structure and the apparatus in a pre-determined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one of the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "intersection" means and includes a location at which two or more features (e.g., regions, structures, materials, trenches, devices) or, alternatively, two or more portions of a single feature meet. For example, an intersection between a first feature extending in a first direction (e.g., an X-direction) and a second feature extending in a second direction (e.g., a Y-direction) different than the first direction may be the location at which the first feature and the second feature meet.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., SiOx, $AlO_x$, $HfO_x$, $NbO_x$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "semiconductor material" refers to a material having an electrical conductivity between those of insulative materials and conductive materials. For example, a semiconductor material may have an electrical conductivity of between about $10^1$ Siemens per centimeter (S/cm) and about $10^4$ S/cm ($10^6$ S/m) at room temperature.

Examples of semiconductor materials include elements found in column IV of the periodic table of elements such as silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_XGa_{1-X}As$), and quaternary compound semiconductor materials (e.g., $Ga_XIn_{1-X}As_YP_{1-Y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Further examples of semiconductor materials include oxide semiconductor materials such as zinc tin oxide ($Zn_xSn_yO$, commonly referred to as "ZTO"), indium zinc oxide ($In_xZn_yO$, commonly referred to as "IZO"), zinc oxide ($Zn_xO$), indium gallium zinc oxide ($In_xGa_yZn_zO$, commonly referred to as "IGZO"), indium gallium silicon oxide ($In_xGa_ySi_zO$, commonly referred to as "IGSO"), indium tungsten oxide ($In_xW_yO$, commonly referred to as "IWO"), gallium oxide ($Ga_xO$), indium oxide ($In_xO$), tin oxide ($Sn_xO$), titanium oxide ($Ti_xO$), other binary metal oxides, zinc oxide nitride ($Zn_xON_z$), magnesium zinc oxide ($Mg_xZn_yO$), zirconium indium zinc oxide ($Zr_xIn_yZn_zO$), hafnium indium zinc oxide ($Hf_xIn_yZn_zO$), tin indium zinc oxide ($Sn_xIn_yZn_zO$), aluminum tin indium zinc oxide ($Al_xSn_yIn_zZn_aO$), silicon indium zinc oxide ($Si_xIn_yZn_zO$), aluminum zinc tin oxide ($Al_xZn_ySn_zO$), gallium zinc tin oxide ($Ga_xZn_ySn_zO$), zirconium zinc tin oxide ($Zr_xZn_ySn_zO$), and other similar materials.

As used herein, the terms "two-dimensional material" and "2D material" mean and include a crystalline material formed of and including a single (e.g., only one) monolayer, or at most two monolayers or three monolayers, of units (e.g., atoms, molecules) bonded together through intramolecular forces (e.g., covalent bonds). Stated another way, a 2D material may be characterized as a crystalline material comprising about three or fewer monolayers bonded together though intramolecular forces.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

FIG. 1 illustrates a simplified cross-sectional view of an inverter 100, in accordance with embodiments of the disclosure. The inverter 100 may be a vertically oriented, such that transistors thereof are offset from one another in a vertical direction (e.g., the Z-direction), as described in further detail below. The inverter 100 may, for example, be a vertically oriented complementary metal-oxide-semiconductor (CMOS) inverter (also referred to herein as a "vertical CMOS inverter"). The inverter 100 may include a transistor 102, an additional transistor 104, and a hybrid gate electrode 106 operatively associated with each of the transistor 102 and the additional transistor 104. The transistor 102 may, for example, be an N-channel metal-oxide-semiconductor (NMOS) transistor; and the additional transistor 104 may, for example, be a P-channel metal-oxide-semiconductor (PMOS) transistor. A ground structure 110 may be connected to a source terminal of the transistor 102; a supply voltage structure 118 (e.g., a supply voltage pumped ($V_{CCP}$) structure) may be electrically connected to a source terminal of the additional transistor 104; an output voltage structure 112 may be electrically connected to drain terminals of the transistor 102 and the additional transistor 104; and an input voltage structure may be electrically connected to the hybrid gate electrode 106.

As shown in FIG. 1, the transistor 102 and the additional transistor 104 of the inverter 100 may be vertically offset (e.g., in the Z-direction) from one another, and may at least partially (e.g., substantially) horizontally overlap (e.g., in the X-direction, in the Y-direction) one another. In some embodiments, the additional transistor 104 vertically overlies (e.g., in the Z-direction) the transistor 102; and the additional transistor 104 is substantially horizontally aligned (e.g., in each of the X-direction and the Y-direction) with the transistor 102.

The hybrid gate electrode 106 of the inverter 100 may be vertically interposed (e.g., in the Z-direction) between and shared by the transistor 102 and the additional transistor 104. Sharing the hybrid gate electrode 106 between the transistor 102 and the additional transistor 104 may improve one or more of microelectronic device scaling, electrical coupling effects, shorts margins, short channel effects, floating body effects, and cross talk as compared to conventional configurations including multiple, non-shared gate electrodes between neighboring transistors (e.g., neighboring NMOS and PMOS transistors). In addition, the hybrid gate electrode 106 may be horizontally interposed (e.g., in the X-direction) between the output voltage structure 112 and each of the ground structure 110 and the supply voltage structure 118.

As depicted in FIG. 1, the hybrid gate electrode 106 may include a first region 106A (e.g., a central region), a second region 106B (e.g., a lower region), and a third region 106C (e.g., an upper region). The first region 106A may be vertically interposed between the second region 106B and the third region 106C. For example, the first region 106A may vertically overlie the second region 106B, and the third region 106C may vertically overlie the second region 106B. The first region 106A, the second region 106B, and the third region 106C may have different material compositions than one another. As described in further detail below, a material composition of the second region 106B may be tailored to (e.g., selected based on) desirable characteristics (e.g., threshold voltage characteristics) of the transistor 102 of the inverter 100; and a material composition of the third region 106C may be tailored to desirable characteristics (e.g., threshold voltage characteristics) of the additional transistor 104 of the inverter 100.

The first region 106A of the hybrid gate electrode 106 may be formed of and include a first conductive material, such as one or more of at least one metal, at least one alloy, and at least one conductive metal-containing material (e.g., a conductive metal nitride, a conductive metal silicide, a conductive metal carbide, a conductive metal oxide). In some embodiments, the first region 106A of the hybrid gate electrode 106 is formed of and includes W. The first region 106A of the hybrid gate electrode 106, including the first conductive material thereof, may be substantially homogeneous or may be heterogeneous.

The second region 106B of the hybrid gate electrode 106 may be formed of and include a second conductive material (e.g., one or more of at least one metal, at least one alloy, and at least one conductive metal-containing material) having a work function facilitating a desirable threshold voltage for the transistor 102. In some embodiments, such as embodiments wherein the transistor 102 is an NMOS transistor, the second conductive material has a work function value within a range of from about 3.0 electronvolts (eV) to about 5.5 eV (e.g., from about 3.90 eV to about 4.20 eV). As a non-limiting example, the second region 106B of the hybrid gate electrode 106 may be formed of and include one or more of at least one N-type doped semiconductor material (e.g., silicon doped with one or more of phosphorus, arsenic, antimony, and bismuth) and at least one metallic material (e.g., an elemental metal, such as aluminum (Al), manganese (Mn), zirconium (Zr), niobium (Nb), hafnium (Hf), tantalum (Ta); a binary metallic material, such as ruthenium tantalum alloy ($Ru_xTa$), tantalum nitride ($Ta_xN$), titanium nitride ($Ti_xN$), tungsten nitride ($W_xN$), aluminum nitride ($Al_xN$); a ternary metallic material, such as titanium aluminum nitride ($Ti_xAl_yN$), titanium silicon nitride ($Ti_xSi_yN$), tungsten aluminum nitride ($W_xAl_yN$); a quaternary metallic material, such as tungsten aluminum carbon nitride ($Ta_xAl_yC_zN$)) having a work function value within a range of from about 3.0 eV to about 5.5 eV (e.g., from about 3.90 eV to about 4.20 eV). The second region 106B of the hybrid gate electrode 106, including the second conductive material thereof, may be substantially homogeneous or may be heterogeneous.

The third region 106C of the hybrid gate electrode 106 may be formed of and include a third conductive material (e.g., one or more of at least one metal, at least one alloy, and at least one conductive metal-containing material) having a work function value facilitating a desirable threshold voltage of the additional transistor 104. In some embodiments, such as embodiments wherein the additional transistor 104 is a PMOS transistor, the third conductive material has a work function value within a range of from about 3.0 eV to about 5.5 eV (e.g., from about 5.0 eV to about 5.25 eV). By way of non-limiting example, the third conductive material of the third region 106C of the hybrid gate electrode 106 may be formed of and include one or more of at least one P-type doped semiconductor material (e.g., silicon doped with one or more of boron (B), aluminum (Al), and gallium (Ga)) and at least one metallic material (e.g., an elemental metal, such as nickel (Ni), cobalt (Co), platinum (Pt), ruthenium (Ru); a binary metallic material, such as ruthenium tantalum alloy ($Ru_xTa$), tantalum nitride ($Ta_xN$), titanium nitride ($Ti_xN$), tungsten nitride ($W_xN$), aluminum nitride (ALA); a ternary metallic material, such as titanium aluminum nitride ($Ti_xAl_yN$), titanium silicon nitride ($Ti_xSi_yN$), tungsten aluminum nitride ($W_xAl_yN$); a quaternary metallic material, such as tungsten aluminum carbon nitride ($Ta_xAl_yC_zN$)) having a work function value within a range of from about 3.0 eV to about 5.5 eV (e.g., from about 5.0 eV to about 5.25 eV). The third region 106C of the hybrid gate electrode 106, including the third conductive material thereof, may be substantially homogeneous or may be heterogeneous.

The hybrid gate electrode 106 may have desired dimensions (e.g., vertical dimensions, horizontal dimensions). By way of non-limiting example, the hybrid gate electrode 106 may have a vertical dimension (e.g., height, vertical thickness) with a range of from about 20 nanometers (nm) to about 100 nm. Each of the first region 106A, the second region 106B, and the third region 106C of the hybrid gate electrode 106 may have substantially the same vertical dimension as each other of the first region 106A, the second region 106B, and the third region 106C; or at least one of the first region 106A, the second region 106B, and the third region 106C of the hybrid gate electrode 106 may have a different vertical dimension that at least one other of the first region 106A, the second region 106B, and the third region 106C. In some embodiments, the second region 106B and the third region 106C of the hybrid gate electrode 106 each individually have a vertical dimension within a range of from about 0.5 nm to about 10 nm.

Still referring to FIG. 1, the transistor 102 of the inverter 100 includes a channel structure 108, the hybrid gate electrode 106, and a gate dielectric material 114 vertically interposed (e.g., in the Z-direction) between the channel structure 108 and the hybrid gate electrode 106. The channel structure 108 may be horizontally interposed (e.g., in the X-direction) between and coupled to the ground structure 110 and the output voltage structure 112. The channel structure 108 is positioned relatively vertically closer to the second region 106B of the hybrid gate electrode 106 than the third region 106C of the hybrid gate electrode 106. The gate dielectric material 114 may vertically extend from and between the channel structure 108 and the second region 106B of the hybrid gate electrode 106.

In some embodiments, the channel structure 108 of the transistor 102 is formed of and includes a material which, upon attainment of threshold voltage, facilitates formation of a conductive path between source and drain terminals of the transistor 102 primarily using electrons as current carriers. As a non-limiting example, the channel structure 108 may be formed of and include at least one semiconductor material, such as one or more of silicon, germanium, at least one compound semiconductor material, and at least one oxide semiconductor material. In some embodiments, the channel structure 108 is formed of and includes polycrystalline silicon. In additional embodiments, the channel structure 108 is formed of and includes oxide semiconductor material. As an additional non-limiting example, the channel structure 108 may be formed of and include at least one 2D material, such as one or more of a transition metal dichalcogenide (TMDC) having the general chemical formula $MX_2$, wherein M is a transition metal (e.g., molybdenum (Mo), tungsten (W), niobium (Nb), zirconium (Zr), hafnium (Hf), rhenium (Re), platinum (Pt), titanium (Ti), tantalum (Ta), vanadium (V), cobalt (Co), cadmium (Cd), chromium (Cr)) and X is a chalcogen (e.g., sulfur (S), selenium (Se), tellurium (Te)); a carbide or carbonitride having the general chemical formula $M_{n+1}X_n$ (also referred to as an "MXene") and including oxygen (—O), hydroxyl (—OH), or fluoro (—F) surface termination, wherein M is a transition metal from Groups IV or V of the Periodic Table of Elements (e.g., Ti, Hf, Zr, V, Nb, Ta) and X is selected from carbon (C) and nitrogen (N); graphene; graphene-oxide; stanine; phosphorene; hexagonal boron nitride (h-BN); borophene; silicene; graphyne; germanene; germanane; a 2D supracrystal; and a monolayer of semiconductor material. In some embodiments, the channel structure 108 is formed of and includes one or more of tungsten sulfide ($WS_2$), tungsten selenide ($WSe_2$), molybdenum sulfide ($MoS_2$), and molybdenum selenide ($MoSe_2$). The channel structure 108 may be substantially homogeneous, or the channel structure 108 may be heterogeneous (e.g., vertically heterogeneous and/or horizontally heterogeneous).

The gate dielectric material 114 of the transistor 102 may be formed of and include at least one dielectric material, such as one or more of at least one dielectric oxide material (e.g., one or more of $SiO_x$, $AlO_x$, phosphosilicate glass, borosilicate glass, borophosphosilicate glass, fluorosilicate glass), at least one dielectric nitride material (e.g., $SiN_y$), and at least one low-K dielectric material (e.g., one or more of silicon oxycarbide ($SiO_xC_y$), silicon oxynitride ($SiO_xN_y$), hydrogenated silicon oxycarbide ($SiC_xO_yH_z$), and silicon oxycarbonitride ($SiO_xC_zN_y$)). The gate dielectric material 114 may be substantially homogeneous, or the gate dielectric material 114 may be heterogeneous. In some embodiments, the gate dielectric material 114 is formed of and includes SiOx (e.g., $SiO_2$). A vertical dimension (e.g., in the Z-direction) of the gate dielectric material 114 may, for example, be within a range of from about 1 nm to about 10 nm.

With continued reference to FIG. 1, the additional transistor 104 of the inverter 100 includes an additional channel structure 116, the hybrid gate electrode 106 (shared with the transistor 102), and an additional gate dielectric material 120 vertically interposed between the additional channel structure 116 and the hybrid gate electrode 106. The additional channel structure 116 may be horizontally interposed (e.g., in the X-direction) between and coupled to the supply voltage structure 118 and the output voltage structure 112. The additional channel structure 116 is positioned relatively vertically closer to the third region 106C of the hybrid gate electrode 106 than the second region 106B of the hybrid gate electrode 106. The additional gate dielectric material 120 may vertically extend from and between the additional channel structure 116 and the third region 106C of the hybrid gate electrode 106.

In some embodiments, the additional channel structure 116 of the additional transistor 104 is formed of and includes a material which, upon attainment of threshold voltage, facilitates formation of a conductive path between source and drain terminals of the additional transistor 104 primarily using holes as current carriers. As a non-limiting example, the additional channel structure 116 may be formed of and include at least one semiconductor material, such as one or more of silicon, germanium, at least one compound semiconductor material, and at least one oxide semiconductor material. In some embodiments, the additional channel structure 116 is formed of and includes polycrystalline silicon. In additional embodiments, additional channel structure 116 is formed of and includes oxide semiconductor material. As an additional non-limiting example, the additional channel structure 116 may be formed of and include at least one 2D material, such as one or more of a TMDC having the general chemical formula $MX_2$, wherein M is a transition metal (e.g., Mo, W, Nb, Zr, Hf, Re, Pt, Ti, Ta, V, Co, Cd, Cr) and X is a chalcogen (e.g., S, Se, Te); a carbide or carbonitride having the general chemical formula $M_{n+1}X_n$ (also referred to as an "MXene") and including oxygen (—O), hydroxyl (—OH), or fluoro (—F) surface termination, wherein M is a transition metal from Groups IV or V of the Periodic Table of Elements (e.g., Ti, Hf, Zr, V, Nb, Ta) and X is selected from C and N; graphene; graphene-oxide; stanine; phosphorene; h-BN; borophene; silicene; graphyne; germanene; germanane; a 2D supracrystal; and a monolayer of semiconductor material. In some embodiments, the additional channel structure 116 is formed of and includes one or more of $WS_2$, $WSe_2$, $MoS_2$, and $MoSe_2$. The additional channel structure 116 may be substantially homogeneous, or the additional channel structure 116 may be heterogeneous (e.g., vertically heterogeneous and/or horizontally heterogeneous).

A material composition of the additional channel structure 116 of the additional transistor 104 may be substantially the same as a material composition of the channel structure 108 of the transistor 102; or the material composition of the additional channel structure 116 of the additional transistor 104 may be different than the material composition of the channel structure 108 of the transistor 102. In some embodiments, the additional channel structure 116 of the additional transistor 104 and the channel structure 108 of the transistor 102 have substantially the same material composition as one another. In additional embodiments, the additional channel structure 116 of the additional transistor 104 and the channel structure 108 of the transistor 102 have different material compositions than one another.

The additional gate dielectric material 120 of the additional transistor 104 may be formed of and include at least one dielectric material, such as one or more of at least one dielectric oxide material (e.g., one or more of $SiO_x$, $AlO_x$, phosphosilicate glass, borosilicate glass, borophosphosilicate glass, fluorosilicate glass), at least one dielectric nitride material (e.g., $SiN_y$), and at least one low-K dielectric material (e.g., one or more of $SiO_xC_y$, $SiO_xN_y$, $SiC_xO_yH_z$, and $SiO_xC_zN_y$). The additional gate dielectric material 120 may be substantially homogeneous, or the additional gate dielectric material 120 may be heterogeneous. In some embodiments, the additional gate dielectric material 120 is formed of and includes SiOx (e.g., $SiO_2$). A vertical dimension (e.g., in the Z-direction) of the additional gate dielectric material 120 may, for example, be within a range of from about 1 nm to about 10 nm.

A material composition of the additional gate dielectric material 120 of the additional transistor 104 may be substantially the same as a material composition of the gate dielectric material 114 of the transistor 102; or the material composition of the additional gate dielectric material 120 of the additional transistor 104 may be different than the material composition of the gate dielectric material 114 of the transistor 102. In some embodiments, the additional gate dielectric material 120 of the additional transistor 104 and the gate dielectric material 114 of the transistor 102 have substantially the same material composition as one another. In additional embodiments, the additional gate dielectric material 120 of the additional transistor 104 and the gate dielectric material 114 of the transistor 102 have different material compositions than one another.

With continued reference to FIG. 1, a vertical offset (e.g., vertical spacing) of the additional channel structure 116 of the additional transistor 104 from the channel structure 108 of the transistor 102 may be defined by a sum of the vertical dimensions of the hybrid gate electrode 106, the gate dielectric material 114 of the transistor 102, and the additional gate dielectric material 120 of the additional transistor 104. In some embodiments, a vertical offset of a lower boundary (e.g., a lower surface) of the additional channel structure 116 of the additional transistor 104 from an upper boundary (e.g., an upper surface) of the channel structure 108 of the transistor 102 is within a range of from about 22 nm to about 120 nm.

The ground structure 110, the supply voltage structure 118, the output voltage structure 112, and the input voltage structure electrically connected to the hybrid gate electrode 106 may individually exhibit configurations (e.g., dimensions, shapes, material compositions, material distributions, orientations, arrangements) facilitating desirable electrical communication between the inverter 100 and additional features (e.g., additional circuitry) of a relatively larger device (e.g., control logic device) including the inverter 100. The ground structure 110, the supply voltage structure 118, the output voltage structure 112, and the input structure of the inverter 100 may each individually be formed of and include conductive material. As shown in FIG. 1, in some embodiments, the ground structure 110, the supply voltage structure 118, and the output voltage structure 112 are individually vertically oriented, such that vertical dimensions (e.g., in the Z-direction) thereof are greater than horizontal dimensions (e.g., in the X-direction, in the Y-direction) thereof; and each individually have a generally columnar shape (e.g., a circular column shape, a rectangular column shape, an ovular column shape, a pillar shape). In additional embodiments, one or more of the ground structure 110, the supply voltage structure 118, and the output voltage structure 112 may have a different orientation (e.g., a horizontal orientation, such that at least one horizontal dimension thereof is greater than a vertical dimension thereof) and/or a different shape (e.g., a non-columnar shape).

Aspects of the inverter 100, such as the configurations and positions of at least the transistor 102, the additional transistor 104, and the hybrid gate electrode 106 thereof, may be employed within and adapted to configurational requirements of various microelectronic devices. As a non-limiting example, at least the aforementioned aspects of the inverter 100 may be employed within and adapted to configurational requirements of additional logic circuitry, such as one or more of a two-input NAND gate, a balanced CMOS inverter, a balanced CMOS transmission pass gate, and a balanced two-input NAND gate.

Thus, in accordance with embodiments of the disclosure, an inverter comprises a transistor, an additional transistor overlying the transistor, and a hybrid gate electrode interposed between and shared by the transistor and the additional transistor. The hybrid gate electrode comprises a region overlying a channel structure of the transistor, an additional region overlying the region and underlying an additional channel structure of the additional transistor, and further region interposed between the region and the additional region. The region has a first material composition. The additional region has a second material composition different than the first material composition of the region.

Figure 2A:
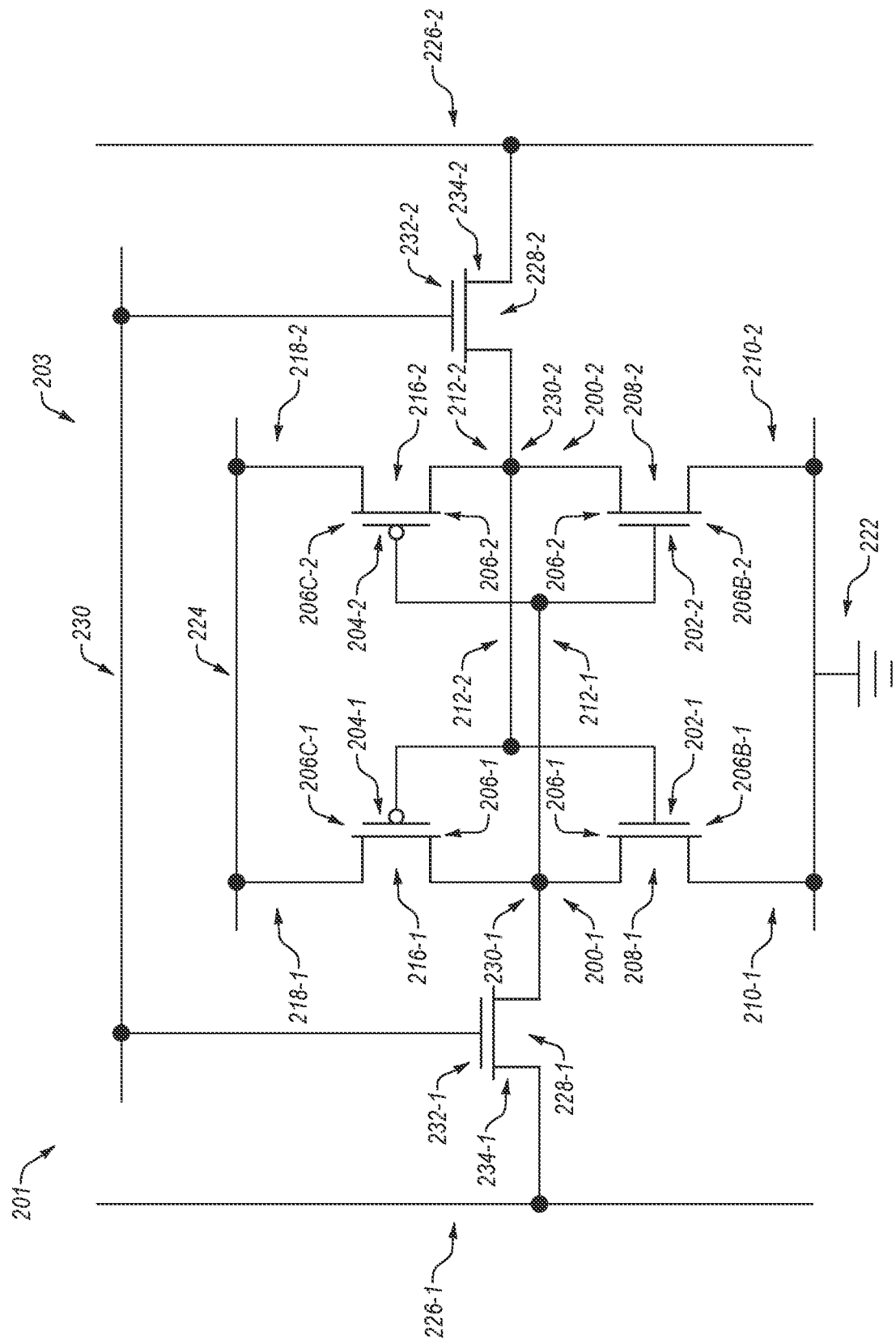
FIG. 2A is an electronic schematic illustration of an SRAM device including inverters individually having a configuration corresponding to that of the inverter of FIG. 1, in accordance with embodiments of the disclosure.
Figure 2B:
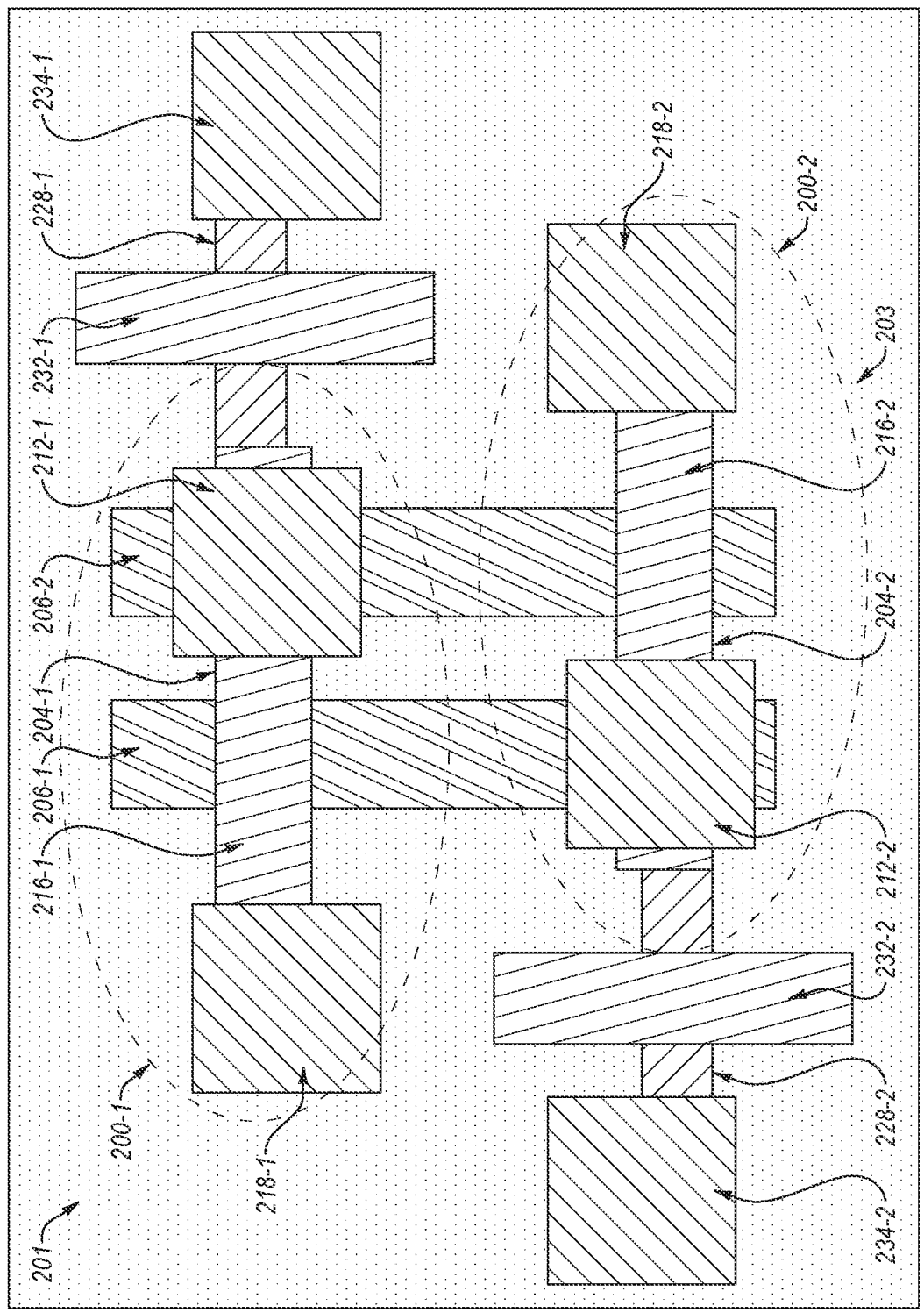
FIG. 2B is a simplified, partial top down view of the SRAM device depicted in FIG. 2A.

The inverter 100 of the disclosure may be utilized within microelectronic devices (e.g., memory devices, such as SRAM devices) of the disclosure. For example, FIG. 2A is an electronic schematic illustration of an SRAM device 201 including inverters individually having a configuration corresponding to (e.g., substantially the same as) that of the inverter 100 previously described with reference to FIG. 1. FIG. 2B is simplified, partial top down view of the SRAM device 201 depicted in FIG. 2A. To avoid repetition, not all features shown in FIGS. 2A and 2B are described in detail herein. Rather, unless described otherwise below, a feature in one or more of FIGS. 2A and 2B designated by a reference numeral that is a 100 increment of the reference numeral of a feature previously described with reference to FIG. 1 will be understood to be substantially similar to the previously described feature. As a non-limiting example, unless described otherwise below, features designated by the reference numerals 200-1 and 200-2 in FIGS. 2A and 2B will individually be understood to be substantially similar to the inverter 100 previously described herein with reference to FIG. 1. As another non-limiting example, unless described otherwise below, features designated by the reference numerals 206-1 and 206-2 in FIGS. 2A and 2B will individually be understood to be substantially similar to the hybrid gate electrode 106 previously described herein with reference to FIG. 1, wherein the features designated by the reference numerals 206B-1 and 206B-2 in FIG. 2A individually correspond to the second region 106B of the hybrid gate electrode 106, and the features designated the reference numerals 206C-1 and 206C-2 individually correspond to the third region 106C of the hybrid gate electrode 106. In addition, unless described otherwise below, features of the inverter 100 previously described with reference to FIG. 1 may also be included, in substantially the same manner (e.g., so as to exhibit substantially similar configurations and positions), within the SRAM device 201 described herein with reference to FIGS. 2A and 2B. For clarity and ease of understanding of the drawings and related description, not all features (e.g., structures, devices, materials) of the SRAM device 201 depicted in one of FIGS. 2A and 2B are depicted in the other of FIGS. 2A and 2B. With the description provided below, it will be readily apparent to one of ordinary skill in the art that the structures and devices described herein may be included in relatively larger structures, devices, and systems.

As shown in FIG. 2A, the SRAM device 201 includes an SRAM cell 203 including cross-coupled inverters and a six (6) transistor (6T) architecture. Four (4) of the six (6) transistors of the SRAM cell 203 may be transistors of a first inverter 200-1 and a second inverter 200-2 of the disclosure, wherein the first inverter 200-1 and the second inverter 200-2 individually have a configuration substantially similar to that previously described herein in relation to the inverter 100 shown in FIG. 1. For example, four (4) of the six (6) transistors of the SRAM cell 203 may include a first transistor 202-1 and a first additional transistor 204-1 of the first inverter 200-1; and a second transistor 202-2 and a second additional transistor 204-2 of the second inverter 200-2. In addition, two (2) other of the six (6) transistors of the SRAM cell 203 may be pass transistors (e.g., control transistors), including a first pass transistor 228-1 (e.g., a first control transistor) and a second pass transistor 228-2 (e.g., a second control transistor). In addition, the SRAM cell 203 may include a first node 230-1 and a second node 230-2 configured and operated for data storage. Data may be stored with either high potential (e.g., logic "1") at the first node 230-1 and low potential (e.g., logic "0") at the second node 230-2; or low potential at the first node 230-1 and high potential at the second node 230-2. Additional features of the SRAM device 201, including additional features of the SRAM cell 203 thereof, are described in further detail below.

The first inverter 200-1 of the SRAM cell 203 may include a first hybrid gate electrode 206-1 vertically interposed between and shared by the first transistor 202-1 and the first additional transistor 204-1 thereof. The first hybrid gate electrode 206-1 may include a second region 206B-1 vertically neighboring and operatively associated with a first channel structure 208-1 of the first transistor 202-1; a third region 206C-1 vertically neighboring and operatively associated with a first channel structure 216-1 of the first additional transistor 204-1; and a first region vertically interposed between the second region 206B-1 and the third region 206C-1. The first hybrid gate electrode 206-1 (including the first region, the second region 206B-1, and the third region 206C-1 thereof) may be substantially similar to the hybrid gate electrode 106 (including the first region 106A, the second region 106B, and the third region 106C thereof) of the inverter 100 previously described with reference to FIG. 1.

The second inverter 200-2 of the SRAM cell 203 may include a second hybrid gate electrode 206-2 vertically interposed between and shared by the second transistor 202-2 and the second additional transistor 204-2 thereof. The second hybrid gate electrode 206-2 may include another second region 206B-2 vertically neighboring and operatively associated with a second channel structure 208-2 of the second transistor 202-2; another third region 206C-2 vertically neighboring and operatively associated with a second channel structure 216-2 of the second additional transistor 204-2; and another first region vertically interposed between the another second region 206B-2 and the another third region 206C-2. The second hybrid gate electrode 206-2 (including the another first region, the another second region 206B-2, and the another third region 206C-2 thereof) may be substantially similar to the hybrid gate electrode 106 (including the first region 106A, the second region 106B, and the third region 106C thereof) of the inverter 100 previously described with reference to FIG. 1.

A source terminal of the first transistor 202-1 of the first inverter 200-1 may be coupled to a first ground structure 210-1 in electrical communication with a conductive ground line 222; and a source terminal of the second transistor 202-2 of the second inverter 200-2 may be coupled to a second ground structure 210-2 in electrical communication with the conductive ground line 222. In addition, a source terminal of the first additional transistor 204-1 of the first inverter 200-1 may be coupled to a first supply voltage structure 218-1 in electrical communication with a conductive supply voltage line 224; and a source terminal of the second additional transistor 204-2 of the second inverter 200-2 may be coupled to a second supply voltage structure 218-2 in electrical communication with the conductive supply voltage line 224.

A first output voltage structure 212-1 may be coupled to drain terminals of the first transistor 202-1 and the first additional transistor 204-1 of the first inverter 200-1, and an input terminal of the second hybrid gate electrode 206-2 operatively associated with the second inverter 200-2. The first output voltage structure 212-1 may be configured to serve as an input voltage structure for the second hybrid gate electrode 206-2 operatively associated with the second inverter 200-2. In addition, a second output voltage structure 212-2 may be coupled to drain terminals of the second transistor 202-2 and the second additional transistor 204-2 of the second inverter 200-2, and an input terminal of the first hybrid gate electrode 206-1 operatively associated with the first inverter 200-1. The second output voltage structure 212-2 may be configured to serve as an input voltage structure for the first hybrid gate electrode 206-1 operatively associated with the first inverter 200-1.

Still referring to FIG. 2A, the first pass transistor 228-1 may include a first gate electrode 232-1 coupled to a conductive word line 230, a first source/drain (S/D) terminal coupled to a first conductive digit line 226-1 by way of a first contact structure 234-1, a second S/D terminal coupled to the first output voltage structure 212-1 (and the drain terminals of the first transistor 202-1 and the first additional transistor 204-1 of the first inverter 200-1), and a channel structure operatively associated with each of the first gate electrode 232-1, the first S/D terminal, and the second S/D terminal. In addition, the second pass transistor 228-2 may include a second gate electrode 232-2 coupled to the conductive word line 230, an additional first S/D terminal coupled to a second conductive digit line 226-2 by way of a second contact structure 234-2, an additional second S/D terminal coupled to the second output voltage structure 212-2 (and the drain terminals of the second transistor 202-2 and the second additional transistor 204-2 of the second inverter 200-2), and an additional channel structure operatively associated with each of the second gate electrode 232-2, the additional first S/D terminal, the additional second S/D terminal.

During use and operation of the SRAM device 201, information may be written to and read from the SRAM cell 203. As previously discussed, data may be stored with either high potential at the first node 230-1 and low potential at the second node 230-2, or low potential at the first node 230-1 and high potential at the second node 230-2. The logic state of the SRAM cell 203 may be read by sensing the cell current on the first conductive digit line 226-1 and the second conductive digit line 226-2 and/or the differential voltage developed thereon. If the SRAM cell 203 is in logic state "1," the first node 230-1 is HIGH and the second node 230-2 is LOW. Conversely, if the SRAM cell 203 is in logic state "0," the first node 230-1 is LOW and the second node 230-2 is HIGH.

Referring to FIG. 2B, the within the SRAM cell 203 of the SRAM device 201, the first inverter 200-1 may be horizontally offset from the second inverter 200-2 in the Y-direction. The first inverter 200-1 may partially (e.g., less than completely) horizontally overlap the second inverter 200-2 in the X-direction orthogonal to the Y-direction. In addition, an arrangement of the first inverter 200-1 and the first pass transistor 228-1 in the X-direction may be inverted (e.g., reversed) relative an arrangement of the second inverter 200-2 and the second pass transistor 228-2 in the X-direction. Accordingly, an arrangement of the first supply voltage structure 218-1, the first output voltage structure 212-1, and the first contact structure 234-1 in the X-direction may be inverted relative an arrangement of the second supply voltage structure 218-2, the second output voltage structure 212-2, and the second contact structure 234-2 in the X-direction. The first hybrid gate electrode 206-1 and the second hybrid gate electrode 206-2 operatively associated with the first inverter 200-1 and the second inverter 200-2 may horizontally extend in parallel with one another in the Y-direction, and may both be horizontally interposed in the X-direction between the first gate electrode 232-1 operatively associated with the first pass transistor 228-1 and the second gate electrode 232-2 operatively associated with the second pass transistor 228-2.

As shown in FIG. 2B, the first output voltage structure 212-1 coupled to the second hybrid gate electrode 206-2 and the drain terminals of the first additional transistor 204-1 and the first transistor 202-1 (FIG. 2A, vertically underlying the first additional transistor 204-1 in the top-down view of FIG. 2B) of the first inverter 200-1 may vertically extend in the Z-direction, and may be horizontally interposed between the second output voltage structure 212-2 and the second supply voltage structure 218-2 in the X-direction. In addition, the second output voltage structure 212-2 coupled to the first hybrid gate electrode 206-1 and the drain terminals of the second additional transistor 204-2 and the second transistor 202-2 (FIG. 2A, vertically underlying the second additional transistor 204-2 in the top-down view of FIG. 2B) of the second inverter 200-2 may vertically extend in the Z-direction, and may be horizontally interposed between the first output voltage structure 212-1 and the first supply voltage structure 218-1 in the X-direction. The first output voltage structure 212-1 may be horizontally offset from the second output voltage structure 212-2 in each of the X-direction and the Y-direction.

Still referring to FIG. 2B, the first supply voltage structure 218-1 coupled to the source terminal of the first additional transistor 204-1 of the first inverter 200-1 may vertically extend in the Z-direction, and may be horizontally interposed between the second output voltage structure 212-2 and the second contact structure 234-2 in the X-direction. The first ground structure 210-1 (FIG. 2A) coupled to the source terminal of the first transistor 202-1 (FIG. 2A) of the first inverter 200-1 may also vertically extend in the Z-direction, and may also be horizontally interposed between the second output voltage structure 212-2 and the second contact structure 234-2 in the X-direction. In addition, the second supply voltage structure 218-2 coupled to the source terminal of the second additional transistor 204-2 of the second inverter 200-2 may vertically extend in the Z-direction, and may be horizontally interposed between the first output voltage structure 212-1 and the first contact structure 234-1 in the X-direction. The second ground structure 210-2 (FIG. 2A) coupled to the source terminal of the second transistor 202-2 (FIG. 2A) of the second inverter 200-2 may also vertically extend in the Z-direction, and may also be horizontally interposed between the first output voltage structure 212-1 and the first contact structure 234-1 in the X-direction.

Thus, in accordance with embodiments of the disclosure, a memory device comprises a memory cell. The memory cell comprises two inverters cross-coupled with one another, and two pass transistors in electrical communication with the two inverters, two digit lines, and a word line. Each of the two inverters comprises an NMOS transistor in electrical communication with a ground line, a PMOS transistor vertically offset from the NMOS transistor and in electrical communication with a supply voltage line, and a gate electrode vertically interposed between and shared by the NMOS transistor and the PMOS transistor. The gate electrode comprises a first material having a first work function value, a second material having a second work function value different than the first work function value, and a third material vertically interposed between the first material and the second material.

Figure 3:
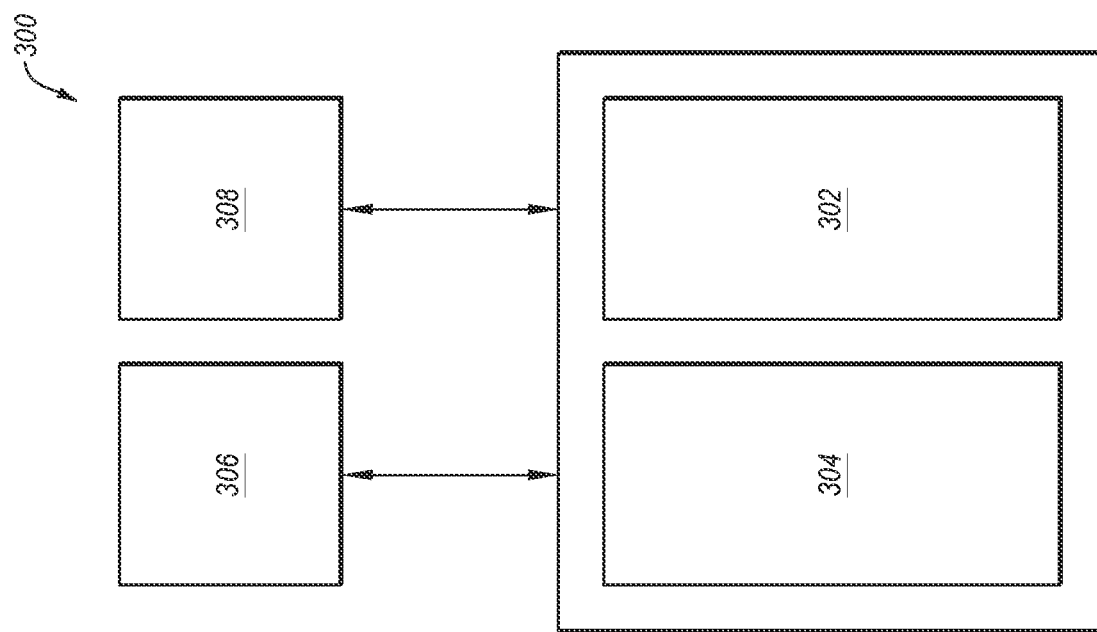
FIG. 3 is a schematic block diagram of an electronic system, in accordance with embodiments of the disclosure.

Inverters (e.g., the inverter 100, the first inverter 200-1, the second inverter 200-2) and memory devices (e.g., the SRAM device 201) in accordance with embodiments of the disclosure may be used in embodiments of electronic systems of the disclosure. For example, FIG. 3 is a schematic block diagram of an electronic system 300 according to embodiments of disclosure. The electronic system 300 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 300 includes a memory device 302. The memory device 302 may include, for example, one or more of an inverter (e.g., the inverter 100, the first inverter 200-1, the second inverter 200-2) and a microelectronic device (e.g., the SRAM device 201) previously described herein. The electronic system 300 may further include an electronic signal processor device 304 (often referred to as a "microprocessor"). The electronic signal processor device 304 may, optionally, include one or more of an inverter (e.g., the inverter 100, the first inverter 200-1, the second inverter 200-2) and a microelectronic device (e.g., the SRAM device 201) previously described herein. While the memory device 302 and the electronic signal processor device 304 are depicted as two (2) separate devices in FIG. 3, in additional embodiments, a single (e.g., only one) memory/processor device having the functionalities of the memory device 302 and the electronic signal processor device 304 is included in the electronic system 300. In such embodiments, the memory/processor device may include one or more of an inverter (e.g., the inverter 100, the first inverter 200-1, the second inverter 200-2) and a microelectronic device (e.g., the SRAM device 201) previously described herein. The electronic system 300 may further include an input device 306 for inputting information into the electronic system 300 by a user, such as, for example, a mouse or other pointing device, a keyboard, a touchpad, a button, or a control panel. The electronic system 300 may further include an output device 308 for outputting information (e.g., visual or audio output) to a user such as, for example, one or more of a monitor, a display, a printer, an audio output jack, and a speaker. In some embodiments, the input device 306 and the output device 308 comprise a single touchscreen device that can be used both to input information to the electronic system 300 and to output visual information to a user. The input device 306 and the output device 308 may electrically communicate with one or more of the memory device 302 and the electronic signal processor device 304.

Thus, in accordance with embodiments of the disclosure, an electronic system comprises an input device, an output device, a processor device operably connected to the input device and the output device, and a memory device operably connected to the processor device and comprising an inverter. The inverter comprises a transistor, an additional transistor vertically overlying the transistor, and a gate electrode vertically interposed between and shared by the transistor and the additional transistor. The gate electrode comprises a region comprising a first material, an additional region vertically overlying the region and comprising a second material different than the first material, and a further region vertically interposed between the region and the additional region and comprising a third material different than the first material and the second material.

The structures and devices of the disclosure advantageously facilitate one or more of improved microelectronic device performance, reduced costs (e.g., manufacturing costs, material costs), increased miniaturization of components, and greater packaging density as compared to conventional structures, conventional devices, and conventional methods. The structures and devices of the disclosure may also improve scalability, efficiency, and simplicity as compared to conventional structures and conventional devices.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalent. For example, elements and features disclosed in relation to one embodiment may be combined with elements and features disclosed in relation to other embodiments of the disclosure.

What is claimed is:

1. An inverter, comprising:
   a transistor;
   an additional transistor overlying the transistor; and
   a hybrid gate electrode interposed between and shared by the transistor and the additional transistor, the hybrid gate electrode comprising:
   a region overlying a channel structure of the transistor and having a first material composition;
   an additional region overlying the region and underlying an additional channel structure of the additional transistor, the additional region having a second material composition different than the first material composition of the region; and
   a further region interposed between the region and the additional region.

2. The inverter of claim 1, wherein:
the transistor comprises an NMOS transistor comprising a source terminal coupled to a ground structure, and a drain terminal coupled to an output voltage structure; and
the additional transistor comprises a PMOS transistor comprising an additional source terminal coupled to a supply voltage structure, and an additional drain terminal coupled to the output voltage structure.

3. The inverter of claim 1, wherein the channel structure of the transistor and the additional channel structure of the additional transistor have substantially the same material composition as one another.

4. The inverter of claim 1, wherein a material composition of the channel structure of the transistor is different than a material composition of the additional channel structure of the additional transistor.

5. The inverter of claim 1, wherein:
the region of the hybrid gate electrode comprises material having a work function value within a range of from about 3.0 eV to about 5.5 eV; and
the additional region of the hybrid gate electrode comprises additional material having a different work function value within the range of from about 3.0 eV to about 5.5 eV than the material.

6. The inverter of claim 5, wherein the material comprises one or more of an N-type doped semiconductor material, an elemental metal, a binary metallic material, a ternary metallic material, and a quaternary metallic material.

7. The inverter of claim 6, wherein the material comprises one or more of elemental aluminum (Al), elemental manganese (Mn), elemental zirconium (Zr), elemental niobium (Nb), elemental hafnium (Hf), elemental tantalum (Ta); ruthenium tantalum alloy ($Ru_xTa$), tantalum nitride ($Ta_xN$), titanium nitride ($Ti_xN$), tungsten nitride ($W_xN$), aluminum nitride ($Al_xN$), titanium aluminum nitride ($Ti_xAl_yN$), titanium silicon nitride ($Ti_xSi_yN$), tungsten aluminum nitride ($W_xAl_yN$); and tungsten aluminum carbon nitride ($Ta_xAl_yC_zN$).

8. The inverter of claim 5, wherein the additional material comprises one or more of a P-type doped semiconductor material, an elemental metal, a binary metallic material, a ternary metallic material, and a quaternary metallic material.

9. The inverter of claim 8, wherein the additional material comprises one or more of elemental nickel (Ni), elemental cobalt (Co), elemental platinum (Pt), elemental ruthenium (Ru), ruthenium tantalum alloy ($Ru_xTa$), tantalum nitride ($Ta_xN$), titanium nitride ($Ti_xN$), tungsten nitride ($W_xN$), aluminum nitride ($Al_xN$), titanium aluminum nitride ($Ti_xAl_yN$), titanium silicon nitride ($Ti_xSi_yN$), tungsten aluminum nitride ($W_xAl_yN$), and tungsten aluminum carbon nitride ($Ta_xAl_yC_zN$).

10. The inverter of claim 1, wherein the further region of the hybrid gate electrode has a third material composition different than each of the first material composition of the region of the hybrid gate electrode and the second material composition of the additional region of the hybrid gate electrode.

11. The inverter of claim 1, wherein:
an overall vertical dimension of the hybrid gate electrode is within a range of from about 20 nm to about 100 nm; and
the region and the additional region of the hybrid gate electrode individually have a vertical dimension within a range of from about 0.5 nm to about 10 nm.

12. A memory device, comprising:
a memory cell comprising:
two inverters cross-coupled with one another, each of the two inverters comprising:
an NMOS transistor in electrical communication with a ground line;
a PMOS transistor vertically offset from the NMOS transistor and in electrical communication with a supply voltage line; and
a gate electrode vertically interposed between and shared by the NMOS transistor and the PMOS transistor, the gate electrode comprising:
a first material having a first work function value;
a second material having a second work function value different than the first work function value; and
a third material vertically interposed between the first material and the second material; and
two pass transistors in electrical communication with the two inverters, two digit lines, and a word line.

13. The memory device of claim 12, wherein:
the first material of the gate electrode is relatively closer to a channel structure of the NMOS transistor than an additional channel structure of the PMOS transistor; and
the second material of the gate electrode is relatively closer to the additional channel structure of the PMOS transistor than the channel structure of the NMOS transistor.

14. The memory device of claim 13, wherein:
the first work function value is within a range of from about 3.0 eV to about 5.5 eV; and
the second work function value is different than the first work function value and is within the range of from about 3.0 eV to about 5.5 eV.

15. The memory device of claim 12, wherein:
drain terminals of the NMOS transistor and the PMOS transistor of a first of the two inverters are coupled to the gate electrode operatively associated with a second of the two inverters; and
drain terminals of the NMOS transistor and the PMOS transistor of the second of the two inverters is coupled to the gate electrode operatively associated with the first of the two inverters.

16. The memory device of claim 15, wherein:
a first vertically extending output voltage structure couples the drain terminals of the NMOS transistor and the PMOS transistor of the first of the two inverters to the gate electrode operatively associated with the second of the two inverters; and
a second vertically extending output voltage structure couples drain terminals of the NMOS transistor and the PMOS transistor of the second of the two inverters to the gate electrode operatively associated with the first of the two inverters.

17. The memory device of claim 16, wherein:
a first of the two pass transistors is coupled to the first vertically extending output voltage structure and a first of the digit lines; and
a second of the two pass transistors is coupled to the second vertically extending output voltage structure and a second of the digit lines.

18. The memory device of claim 17, wherein a first arrangement of the first of the two inverters and the first of the two pass transistors in a first horizontal direction is reversed relative to a second arrangement of the second of the two inverters and the second of the two pass transistors in the first horizontal direction.

19. The memory device of claim 12, wherein the two inverters are offset from one another in each of a first horizontal direction and a second horizontal direction orthogonal to the first horizontal direction.

20. An electronic system, comprising:
- an input device;
- an output device;
- a processor device operably connected to the input device and the output device; and
- a memory device operably connected to the processor device and comprising an inverter comprising:
  - a transistor;
  - an additional transistor vertically overlying the transistor; and
  - a gate electrode vertically interposed between and shared by the transistor and the additional transistor, the gate electrode comprising:
    - a region comprising a first material;
    - an additional region vertically overlying the region and comprising a second material different than the first material; and
    - a further region vertically interposed between the region and the additional region, the further region comprising a third material different than the first material and the second material.

* * * * *

UNITED STATES PATENT AND TRADEMARK OFFICE
CERTIFICATE OF CORRECTION

PATENT NO. : 11,791,391 B1
APPLICATION NO. : 17/655479
DATED : October 17, 2023
INVENTOR(S) : Kamal M. Karda et al.

It is certified that error appears in the above-identified patent and that said Letters Patent is hereby corrected as shown below:

In the Specification

| | | |
|---|---|---|
| Column 4, | Line 35, | change "oxide ($MgO_x$), at" to --oxide ($MgO_x$)), at-- |
| Column 4, | Line 66, | change "about 10' Siemens" to --about $10^{-8}$ Siemens-- |
| Column 7, | Line 50, | change "nitride (ALA); a" to --nitride ($Al_xN$); a-- |
| Column 8, | Lines 49-50, | change "oxygen (—O), hydroxyl (—OH), or fluoro (—F)" to --oxygen (-O), hydroxyl (-OH), or fluoro (-F)-- |
| Column 9, | Lines 51-52, | change "oxygen (—O), hydroxyl (—OH), or fluoro (—F)" to --oxygen (-O), hydroxyl (-OH), or fluoro (-F)-- |

Signed and Sealed this
Twentieth Day of February, 2024

Katherine Kelly Vidal
*Director of the United States Patent and Trademark Office*